(12) United States Patent
Lin

(10) Patent No.: US 10,720,507 B2
(45) Date of Patent: Jul. 21, 2020

(54) FINFET DEVICE AND METHOD OF MANUFACTURE

(71) Applicant: Taiwan Semiconductor Manufacturing Company, Ltd., Hsinchu (TW)

(72) Inventor: Hsiang-Wei Lin, New Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/129,178

(22) Filed: Sep. 12, 2018

(65) Prior Publication Data
US 2019/0103309 A1 Apr. 4, 2019

Related U.S. Application Data

(60) Provisional application No. 62/566,055, filed on Sep. 29, 2017.

(51) Int. Cl.
| | |
|---|---|
| H01L 29/08 | (2006.01) |
| H01L 29/78 | (2006.01) |
| H01L 29/417 | (2006.01) |
| H01L 29/66 | (2006.01) |
| H01L 21/768 | (2006.01) |
| H01L 21/02 | (2006.01) |
| H01L 21/311 | (2006.01) |
| H01L 27/092 | (2006.01) |
| H01L 21/8238 | (2006.01) |

(52) U.S. Cl.
CPC .... *H01L 29/6653* (2013.01); *H01L 21/02063* (2013.01); *H01L 21/02126* (2013.01); *H01L 21/02203* (2013.01); *H01L 21/31116* (2013.01); *H01L 21/76805* (2013.01); *H01L 21/76814* (2013.01); *H01L 21/76834* (2013.01); *H01L 21/823821* (2013.01); *H01L 27/0924* (2013.01); *H01L 29/0847* (2013.01); *H01L 29/41791* (2013.01); *H01L 29/66795* (2013.01); *H01L 29/785* (2013.01); *H01L 29/7851* (2013.01)

(58) Field of Classification Search
CPC ..... H01L 21/823418; H01L 21/823431; H01L 21/823468; H01L 29/0843; H01L 29/41791; H01L 29/42316; H01L 29/42364; H01L 29/66545; H01L 29/6653; H01L 29/6656; H01L 29/66795; H01L 29/785; H01L 29/7851; H01L 27/0886; H01L 27/0924
See application file for complete search history.

(56) References Cited

U.S. PATENT DOCUMENTS

2015/0303118 A1\* 10/2015 Wang .............. H01L 21/823481
257/401

\* cited by examiner

*Primary Examiner* — Robert G Bachner
*Assistant Examiner* — Molly K Reida
(74) *Attorney, Agent, or Firm* — Slater Matsil, LLP

(57) ABSTRACT

A semiconductor device includes a fin extending from an upper surface of a substrate, a gate stack disposed over the fin, a first dielectric material disposed on a sidewall of the gate stack, an epitaxy region disposed adjacent the fin, a second dielectric material disposed on the epitaxy region and on a sidewall of the first dielectric material, wherein the second dielectric material has a greater thickness in a first portion over the epitaxy region than in a second portion over the epitaxy region disposed closer to the substrate than the first portion, a third dielectric material disposed on the second dielectric material, and a conductive feature extending through the third dielectric material and the second dielectric material to contact the epitaxy region.

20 Claims, 11 Drawing Sheets

FIG. 10

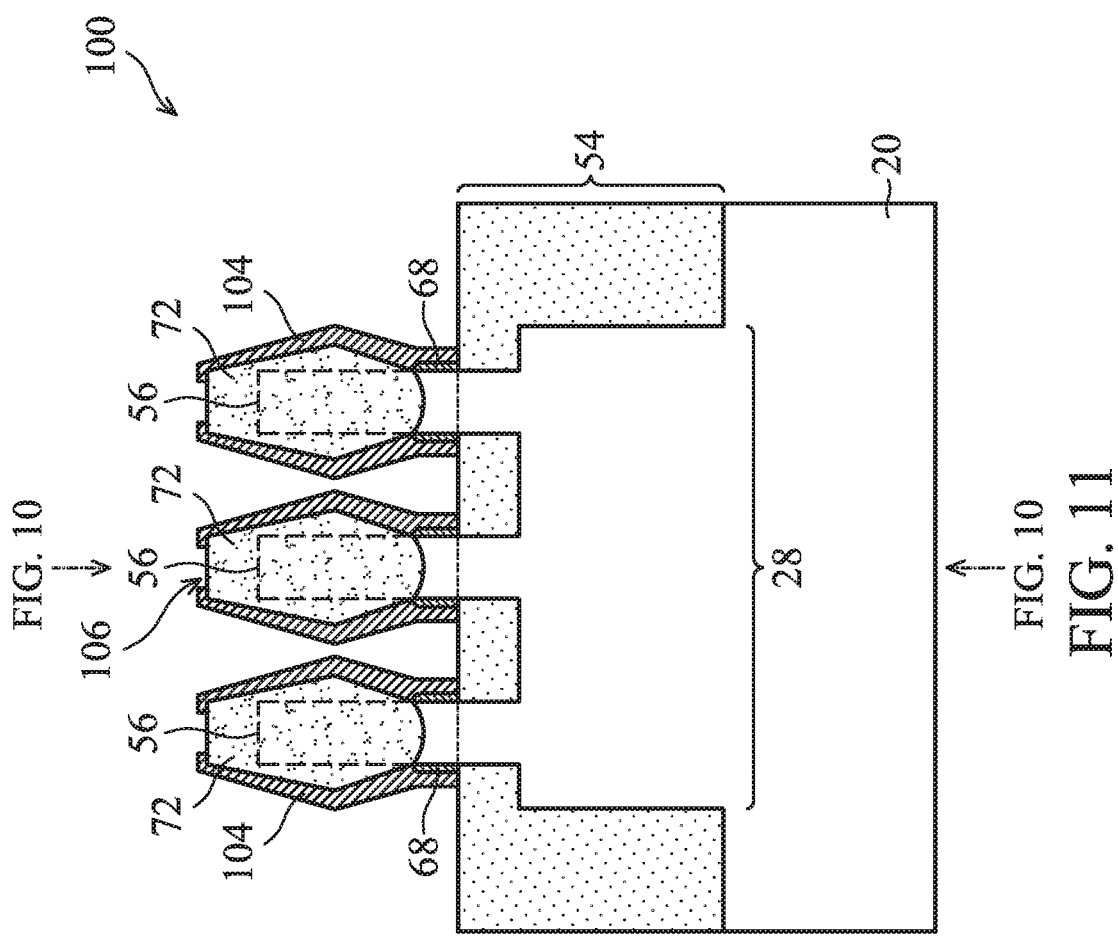

FINFET DEVICE AND METHOD OF MANUFACTURE

PRIORITY CLAIM AND CROSS-REFERENCE

This application claims the benefit of U.S. Provisional Application No. 62/566,055, "FinFET Device and Method of Forming Same" filed on Sep. 29, 2017, which application is hereby incorporated herein by reference.

BACKGROUND

Technological advances in Integrated Circuit (IC) materials and design have produced generations of ICs, with each generation having smaller and more complex circuits than the previous generations. In the course of IC evolution, functional density (for example, the number of interconnected devices per chip area) has generally increased while geometry sizes have decreased. This scaling down process provides benefits by increasing production efficiency and lowering associated costs.

Such scaling down has also increased the complexity of processing and manufacturing ICs and, for these advances to be realized, similar developments in IC processing and manufacturing are needed. For example, Fin Field-Effect Transistors (FinFETs) have been introduced to replace planar transistors. The structures of FinFETs and methods of fabricating FinFETs are being developed.

The formation of FinFETs typically involves forming semiconductor fins, implanting the semiconductor fins to form well regions, forming dummy gate electrodes on the semiconductor fins, etching end portions of the semiconductor fins, and performing an epitaxy to regrow source/drain regions.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 6 through 11 are cross-sectional views of intermediate stages in the formation of FinFETs in accordance with some embodiments.

DETAILED DESCRIPTION

Figure 1:
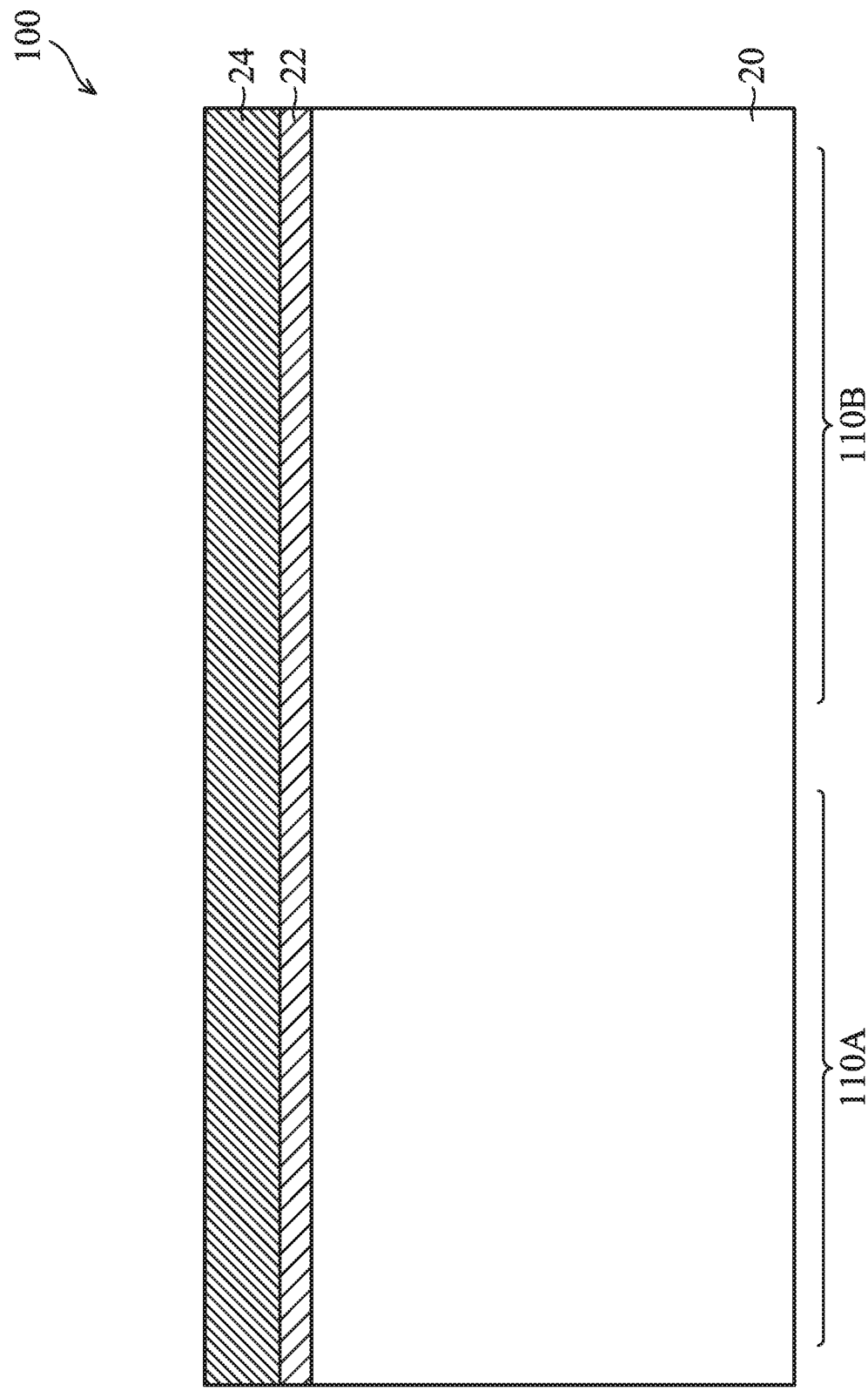
FIGS. 1 through 3 are cross-sectional views of intermediate stages in the formation of Fin Field-Effect Transistors (FinFETs) in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments will be described with respect to a specific context, namely, a fin structure and a method of forming the same. In some embodiments, a fin structure may be used to form a fin field-effect transistor (FinFET). Various embodiments described herein allow for improved performance of a FinFET device. In some cases, the alternating-current (AC) performance of a FinFET device may be improved without sacrificing the direct-current (DC) performance. In some cases, the embodiments described herein can reduce capacitance between a metal gate contact and a metal source/drain contact in a FinFET device. In some cases, the performance of devices such as a ring oscillator may be improved using the techniques described herein. For example, reducing capacitance in this manner may allow for higher frequency operation and may also reduce parasitic capacitive coupling between signals in devices such as a ring oscillator.

The fins of a FinFET device may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins. Various embodiments presented herein are discussed in the context of FinFETs formed using a gate-last process. In other embodiments, a gate-first process may be used. Also, some embodiments contemplate aspects used in planar devices, such as planar FETs.

FIG. 1 illustrates a cross-sectional view of substrate 20, which is a part of wafer 100. Substrate 20 may be, for example, a bulk substrate or a semiconductor-on-insulator (SOI) substrate. In accordance with some embodiments of the present disclosure, substrate 20 is formed of a semiconductor material selected from, and not limited to, silicon germanium, silicon carbon, germanium, and III-V compound semiconductor materials such as GaAsP, AlInAs, AlGaAs, GaInAs, GaInP, GaInAsP, and the like. Substrate 20 may be lightly doped with a p-type or an n-type impurity. Wafer 100 includes N-type Metal Oxide Semiconductor (NMOS) region 110A and P-type Metal Oxide Semiconductor (PMOS) region 110B, in which a NMOS transistor and a PMOS transistor, respectively, are to be formed.

Pad oxide 22 and a mask 24 are formed over semiconductor substrate 20. In accordance with some embodiments of the present disclosure, pad oxide 22 is formed of silicon oxide, which may be formed by oxidizing a surface layer of semiconductor substrate 20. In some embodiments, mask 24 is considered a hard mask. Mask 24 may be formed of silicon nitride (SiN), silicon oxynitride (SiON), silicon carbide (SiC), silicon carbo-nitride (SiCN), SiOCN, or the like. In accordance with some embodiments of the present disclosure, mask 24 is formed of SiN, for example, using Low-Pressure Chemical Vapor Deposition (LPCVD). In accordance with other embodiments of the present disclosure, mask 24 is formed by thermal nitridation of silicon, Plasma Enhanced Chemical Vapor Deposition (PECVD), or plasma anodic nitridation.

Figure 2:
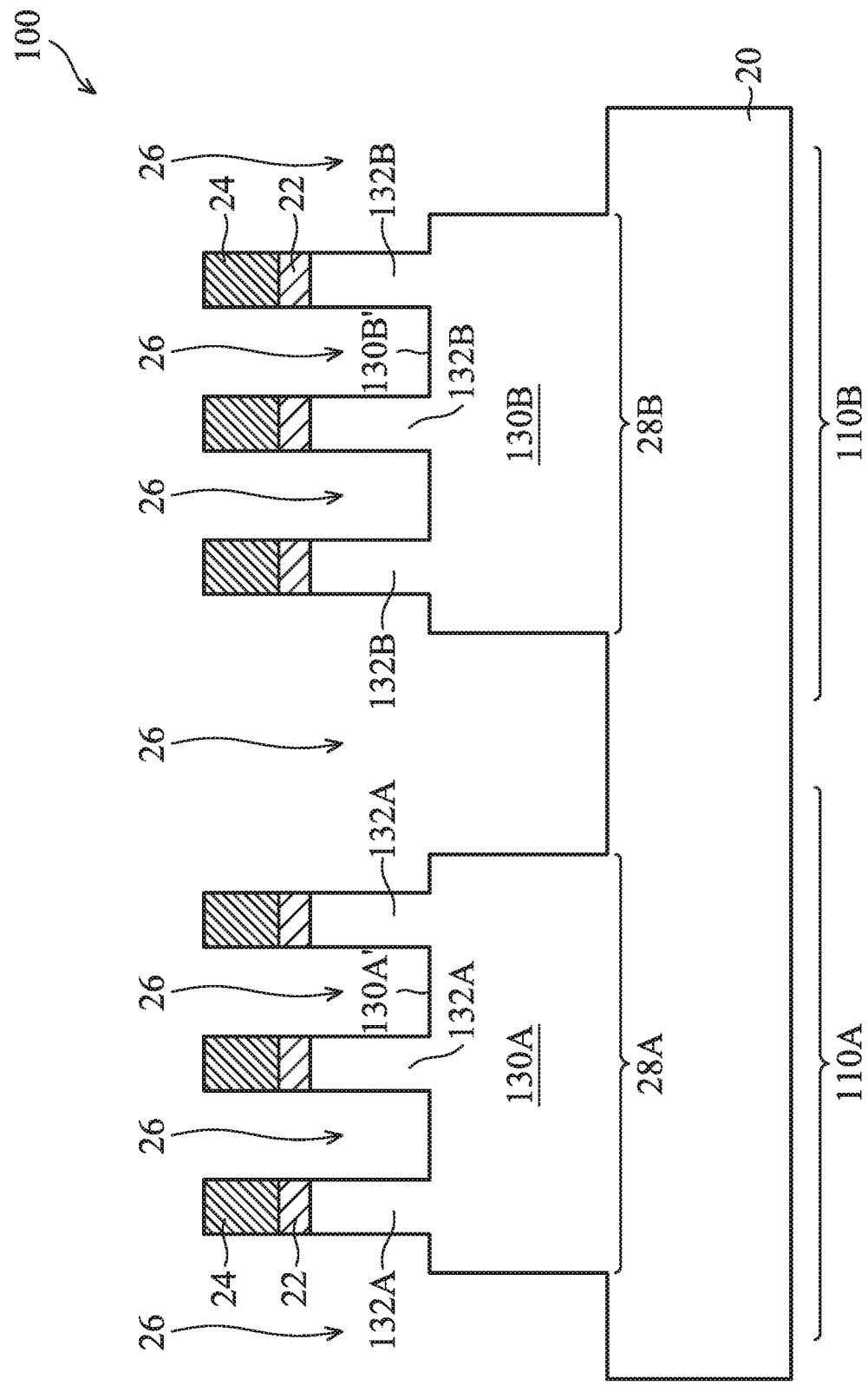

Next, as shown in FIG. 2, mask 24, pad oxide 22, and substrate 20 are patterned to form trenches 26, during which mask 24 is patterned first, and is then used as an etching mask to pattern the underlying pad oxide 22 and substrate 20. Accordingly, semiconductor strips 28A and 28B are formed in NMOS region 110A and PMOS region 110B, respectively. Trenches 26 extend into semiconductor substrate 20 and separate semiconductor strips 28A and 28B from each other. In the top view of wafer 100, each or some of semiconductor strips 28A and 28B may be encircled by respective trenches 26.

In accordance with some embodiments of the present disclosure, semiconductor strips 28A and 28B are referred to as crown-shape semiconductor strips. Semiconductor strip 28A includes semiconductor base 130A and semiconductor strips 132A over base 130A. Semiconductor strip 28B includes semiconductor base 130B and semiconductor strips 132B over base 130B. Although FIG. 2 illustrates that there are three semiconductor strips 132A (or 132B) over base 130A (or 130B), the number of semiconductor strips 132A and 132B on each of the respective bases 130A and 130B may be any integer number such as 1, 2, 3, 4, 5, or more, depending on the desirable drive currents of the resulting FinFETs. The top surface 130A' of base 130A and top surface 130B' of base 130B may be substantially planar, or may be curved with dishing. In some embodiments, semiconductor strips 28A and 28B are not formed having a crown-shape, and in some cases bases 130A and 130B may not be present. In some cases, semiconductor strips 132A and 132B may be formed directly over the substrate 20.

In accordance with some embodiments of the present disclosure, the formation of semiconductor strips 28A and 28B includes etching semiconductor substrate 20 to form semiconductor strips 132A and 132B, forming sacrificial spacer layers (not shown) to cover the sidewalls of semiconductor strips 132A and 132B, and using the sacrificial spacer layers and masks 24 in combination as an etching mask to further etch semiconductor substrate 20. The semiconductor strips 132A/132B may thus be the same material(s) as the substrate 20, described above. The neighboring semiconductor strips 132A are close to each other, and hence the portions of semiconductor substrate 20 between neighboring semiconductor strips 132A/132B are not etched down. As a result, bases 130A and 130B are formed. The sacrificial spacer layers are then removed. The sacrificial spacer layers may be removed using owe or more suitable etching processes, such as using a wet etching process and/or a dry etching process. In other embodiments, the semiconductor substrate 20 is etched to first form bases 130A and 130B, and then bases 130A and 130B are etched to form semiconductor strips 132A and 132B.

Figure 3:
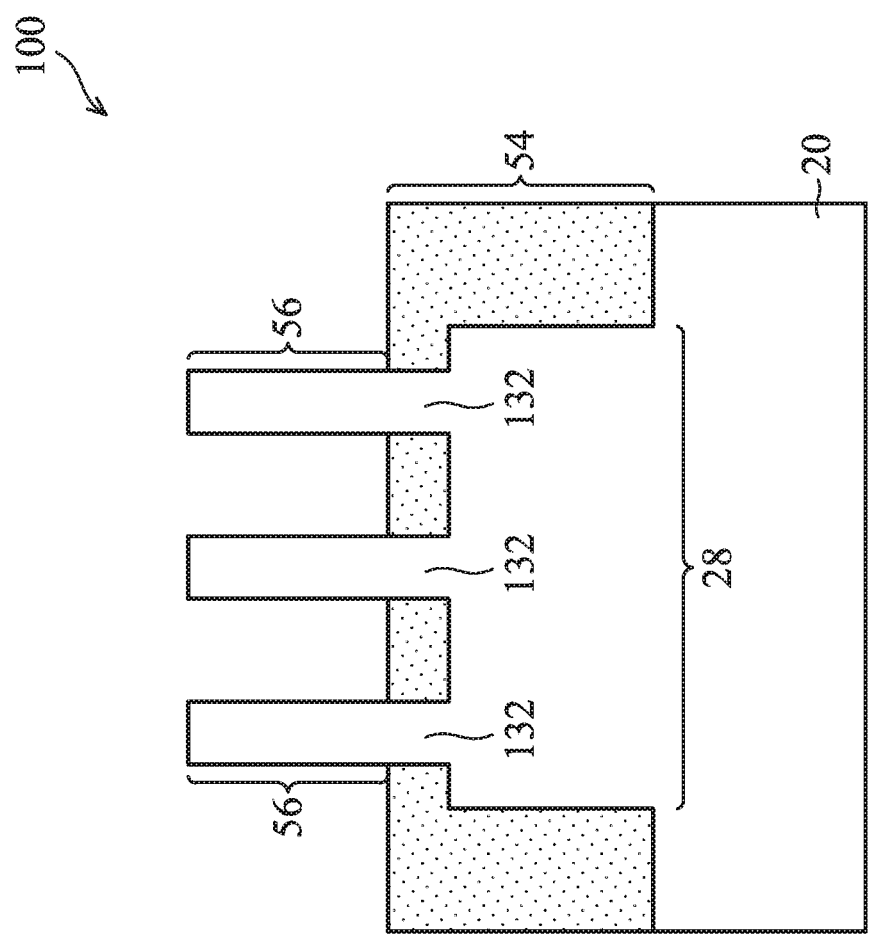

In the subsequent process steps, n-type FinFETs and p-type FinFETs are formed, for example, in NMOS region 110A and PMOS region 110B, respectively. The subsequent drawings illustrate the formation of one FinFET, which represents both n-type FinFETs and p-type FinFETs. For example, referring to FIG. 3, when the respective FinFET that is to be formed is an n-type FinFET, the structure shown in FIG. 3 represents the structure shown in NMOS region 110A (see FIG. 2). Accordingly, strips 132 represent semiconductor strips 132A, and crown-shape semiconductor strip 28 represents semiconductor strip 28A. When the respective FinFET that is to be formed is a p-type FinFET, the structure shown in FIG. 3 represents the structure shown in PMOS region 110B (see FIG. 4). Accordingly, strips 132 represent semiconductor strips 132B, and crown-shape semiconductor strip 28 represents semiconductor strip 28B. It is appreciated that both the n-type and p-type FinFETs are formed on the same wafer 100 and in the same chips.

FIG. 3 illustrates the formation and recess of dielectric material to form Shallow Trench Isolation (STI) regions 54, which fills the trenches separating semiconductor strips 132. The dielectric material may be formed of silicon oxide, silicon carbine, silicon nitride, the like, or multi-layers thereof. The formation method of the dielectric material may be selected from Flowable Chemical Vapor Deposition (FCVD), spin-on coating, Chemical Vapor Deposition (CVD), ALD, High-Density Plasma Chemical Vapor Deposition (HDPCVD), LPCVD, and the like. The dielectric material may be free from n-type and p-type dopants. In accordance with some embodiments in which FCVD is used, a silicon-containing precursor (for example, trisilylamine (TSA) or disilylamine (DSA)) is used, and the resulting dielectric material is flowable (jelly-like). In accordance with alternative embodiments of the present disclosure, the flowable dielectric material is formed using an alkylamino silane based precursor. During the deposition, plasma is turned on to activate the gaseous precursors for forming the flowable oxide.

After the dielectric material is formed, an anneal step may be performed on wafer 100. The dielectric material, if being flowable at this time, will be converted into a solid dielectric material. The anneal also improves the quality of the dielectric material, for example, resulting in the increase in the density of the dielectric material. In accordance with some embodiments of the present disclosure, the anneal is performed using a method selected from furnace anneal, chamber anneal, tube anneal or the like. For example, when furnace anneal is performed, the annealing temperature may be between about 750° C. and about 1,050° C., and the anneal duration may be in the range between about 10 minutes and about 30 minutes. The annealing may be performed in an oxygen-containing environment or in an environment not containing oxygen ($O_2$, $O_3$, or the like).

A planarization process, such as a chemical mechanical polish (CMP), may then be performed remove any excess dielectric material from over the semiconductor strips 132. The mask 24 and the pad oxide 22 (see FIG. 2) may also be removed by the planarization process. The dielectric material is then recessed to form STI regions 54. The recessing may be performed using an isotropic etching process, which may be a dry etch process or a wet etch process. For example, an isotropic etching process that is selective to the dielectric material over the material of the semiconductor fins 132 may be used. In some embodiments, a wet etching process (e.g., using dilute HF) may be used, or another etching process may be used. The recessing of STI regions 54 results in the top portions of semiconductor strips 132 to protrude over the top surfaces of STI regions 54. The protruding portions are referred to as semiconductor fins (or protruding fins) 56 hereinafter.

Figure 4:
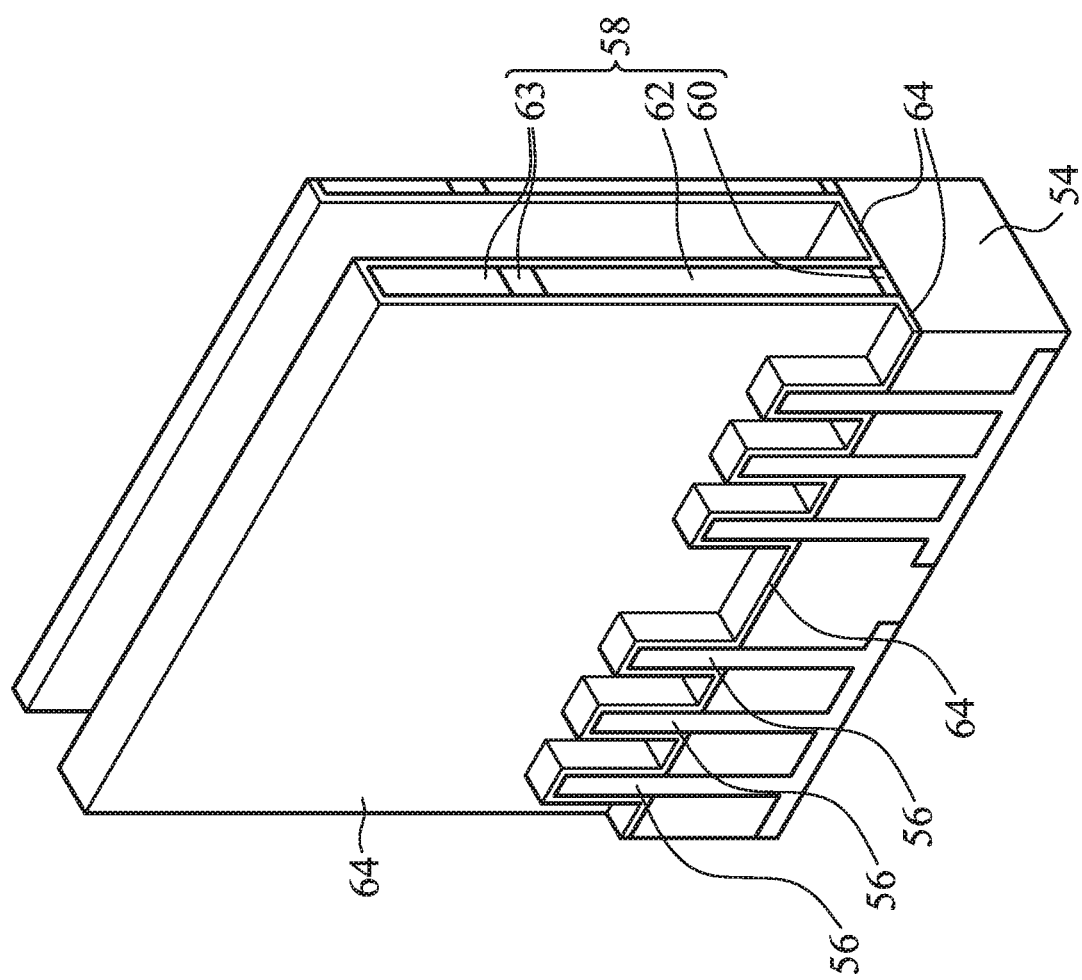
FIGS. 4 through 5 are perspective views of intermediate stages in the formation of FinFETs in accordance with some embodiments.
Figure 6:
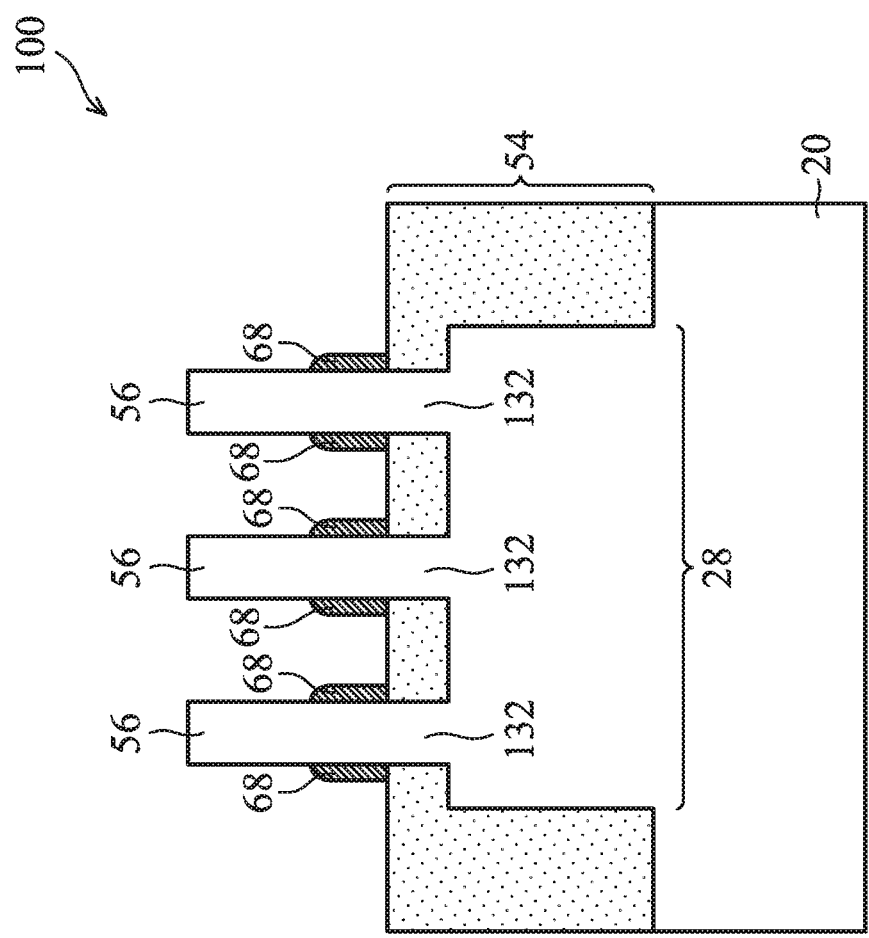

FIG. 4 illustrates the perspective view of the formation of dummy gate stack 58 over channel regions of semiconductor fins 56 in accordance with some embodiments of the present disclosure. Dummy gate stack 58 may include dummy gate dielectric 60 and dummy gate electrode 62 over dummy gate dielectric 60. FIG. 6 also shows mask 63 formed over dummy gate stack 58, and spacer layer 64 formed as a blanket layer over dummy gate stack 58, mask 63, semiconductor fins 56, and STI regions 54. Dummy gate dielectric 60 may be, for example, silicon oxide, silicon nitride, a combination thereof, or the like, and may be deposited (using, for example, CVD, PVD, a combination thereof, or the like) or thermally grown (for example, using thermal oxidation, or the like) according to acceptable techniques. Dummy gate electrode 62 is formed over dummy gate dielectric 60. In some embodiments, dummy gate electrode 62 may be deposited over the dummy gate dielectric 60 and then planarized using, for example, a CMP process. Dummy gate electrode 62 may be a conductive material, such as polycrystalline-silicon (polysilicon), poly-crystalline silicon-germanium (poly-SiGe), metallic nitrides, metallic silicides, metallic oxides, metals, or the like. In one embodiment, amorphous silicon is deposited and recrystallized to create polysilicon. Dummy gate electrode 62 may be deposited by physical vapor deposition (PVD), CVD, sputter deposition, or other techniques known and used in the art for depositing materials. In other cases, dummy gate electrode 62 may be made of these or other materials that have a high etching selectivity from the etching of isolation regions.

Mask 63 may be formed over dummy gate electrode 62. In some embodiments, mask 63 may be considered a hard mask, and mask 63 may be formed of one or more layers of silicon oxide, silicon nitride, silicon carbonitride, the like, a combination, or other materials. In some embodiments, a blanket dummy gate dielectric layer is deposited over wafer 100, and a blanket dummy gate electrode layer is formed over the blanket dummy gate dielectric layer. A blanket mask layer is formed over the blanket dummy gate electrode layer and then is patterned using acceptable photolithography and etching techniques to form mask 63. The pattern of mask 63 then is transferred to dummy gate dielectric 60 and dummy gate electrode 62 by acceptable etching techniques, forming dummy gate stack 58. In other embodiments, dummy gate stack 58 may be formed using different process steps, additional process steps, or other techniques.

Spacer layer 64 is then formed over wafer 100 as a blanket layer, as shown in FIG. 4. In accordance with some embodiments of the present disclosure, spacer layer 64 is formed using a conformal deposition method such as ALD, CVD, etc., so that the sidewall portions of spacer layer 64 have an adequate thickness. The horizontal portions and vertical portions of spacer layer 64 may have substantially the same thickness, for example, with the vertical thickness of the vertical portions and the horizontal thickness of the horizontal portions having a difference smaller than 20 percent of the horizontal thickness. Spacer layer 64 may be formed using a process such as CVD, ALD, HDPCVD, LPCVD, or another process. In some embodiments, spacer layer 64 is a low-K material. In some embodiments, spacer layer 64 may include one or more layers of a material such as silicon oxide, silicon oxycarbide, silicon oxycarbonitride, silicon nitride, silicon oxynitride, a metal oxide such as aluminum oxide, the like, a combination, or another material. In some embodiments, spacer layer 64 is a material having a composition that includes hydrogen. In accordance with some embodiments of the present disclosure, spacer layer 64 is formed of silicon oxycarbonitride, and may have a single-layer structure. In some embodiments, spacer layer 64 is a material having an atomic composition including more than about 20% nitrogen. In accordance with alternative embodiments, spacer layer 64 has a composite structure including a plurality of layers. For example, spacer layer 64 may include a silicon oxide layer, and a silicon nitride layer over the silicon oxide layer. In some embodiments, spacer layer 64 has a thickness between about 10 Å and about 100 Å.

Figure 5:
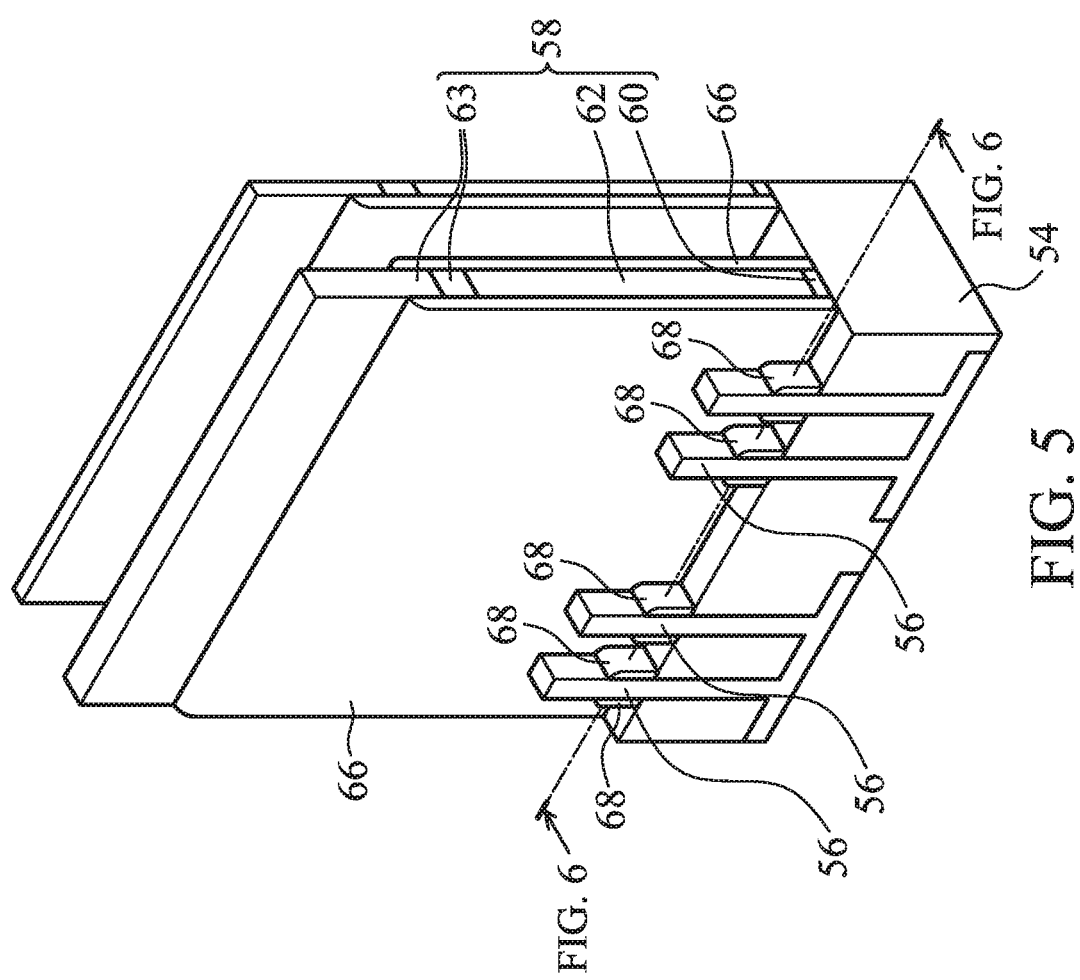

Referring to FIG. 5, an anisotropic etching is performed to remove the horizontal portions of spacer layer 64. For example, an anisotropic dry etch process or an anisotropic wet etch process may be performed. For example, a dry etch process may be performed using $CH_3F$, $O_2$, $CH_4$, HBr, He, other gases, or a combination thereof as the etching gases. The remaining vertical portions of spacer layer 64 form gate spacers 66 on the sidewalls of dummy gate stack 58, and fin spacers 68 on the sidewalls of semiconductor fins 56. FIG. 6 illustrates a cross-sectional view of a portion of the structure shown in FIG. 5, wherein the cross-sectional view is obtained from the vertical plane crossing the labeled line "FIG. 6" in FIG. 5. The cross-sectional views shown in subsequent FIG. 7 and FIG. 8 are also obtained from the same vertical plane "FIG. 6" shown in FIG. 5.

Figure 7:
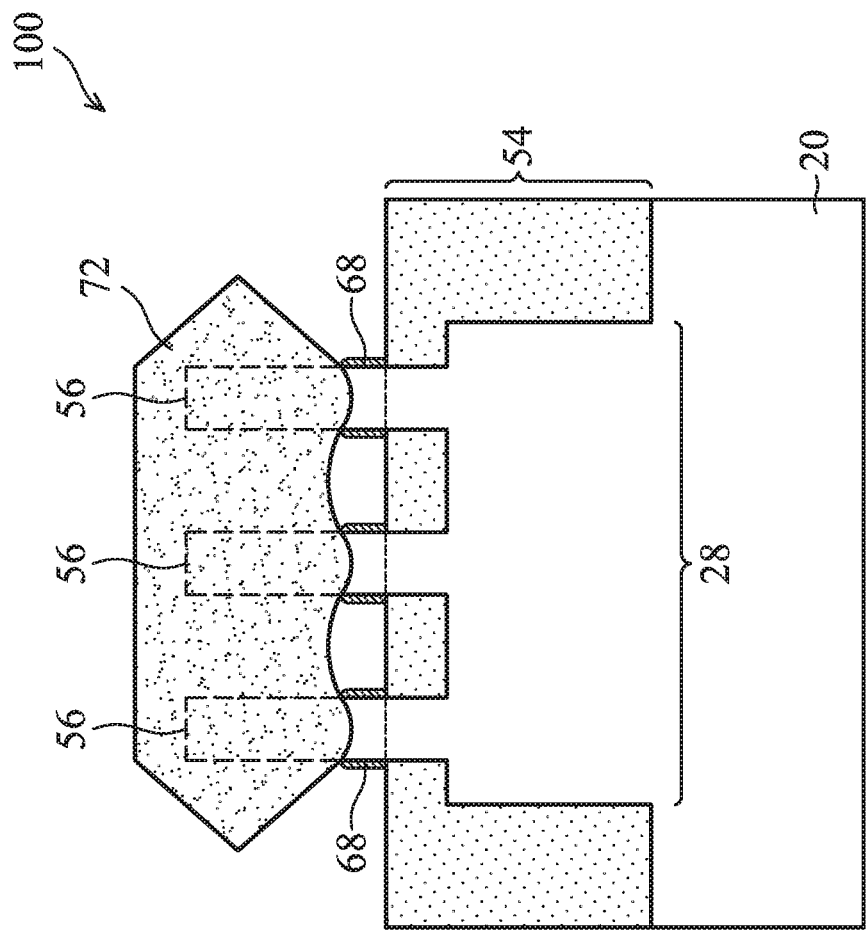

Next, as shown in FIG. 7, the exposed portions of semiconductor fins 56 are recessed in an etching process, and epitaxy region 72 is grown from remaining fins 56 or strip 132. The etching process may include a suitable anisotropic dry etching process. In some embodiments, dummy gate stack 58, fin spacers 68 or STI regions 54 may be used as a combined mask. The anisotropic dry etching process may include a reactive ion etch (RIE), neutral beam etch (NBE), the like, or a combination thereof. In some embodiments, the anisotropic etching process may be performed using a process gas mixture including $CH_3F$, $CH_4$, HBr, $O_2$, Ar, a combination thereof, or the like. FIG. 7 shows the same cross-sectional view obtained from the vertical plane crossing the labeled line "FIG. 6" in FIG. 5. FIG. 7 shows epitaxy region 72 as merged between each of fins 56, but in other embodiments a separated epitaxy region 72 may be grown unmerged on each fin 56. (An example embodiment with unmerged epitaxy regions 72 is shown in FIG. 11, described in greater detail below.) Epitaxy region 72 forms a source/drain region of the resulting FinFET. Epitaxy region 72 may include silicon germanium (SiGe) doped with boron when the respective FinFET is a p-type FinFET, or may include silicon phosphorous (SiP) or silicon carbon phosphorous (SiCP) when the respective FinFET is an n-type FinFET. In some embodiments, the types of dopants or doping concentrations of dopants within epitaxy region 72 may vary throughout epitaxy region 72. For example, the doping concentration within epitaxy region 72 may change from a first concentration closer to the fin 56 to a second concentration farther from the fin 56. The concentrations may change smoothly across a portion of epitaxy region 72 (e.g., a concentration gradient) or may change in a more irregular or more abrupt manner (e.g., a stepped concentration profile). Epitaxy region 72 may be formed from one or more separate epitaxial deposition steps.

Figure 8:
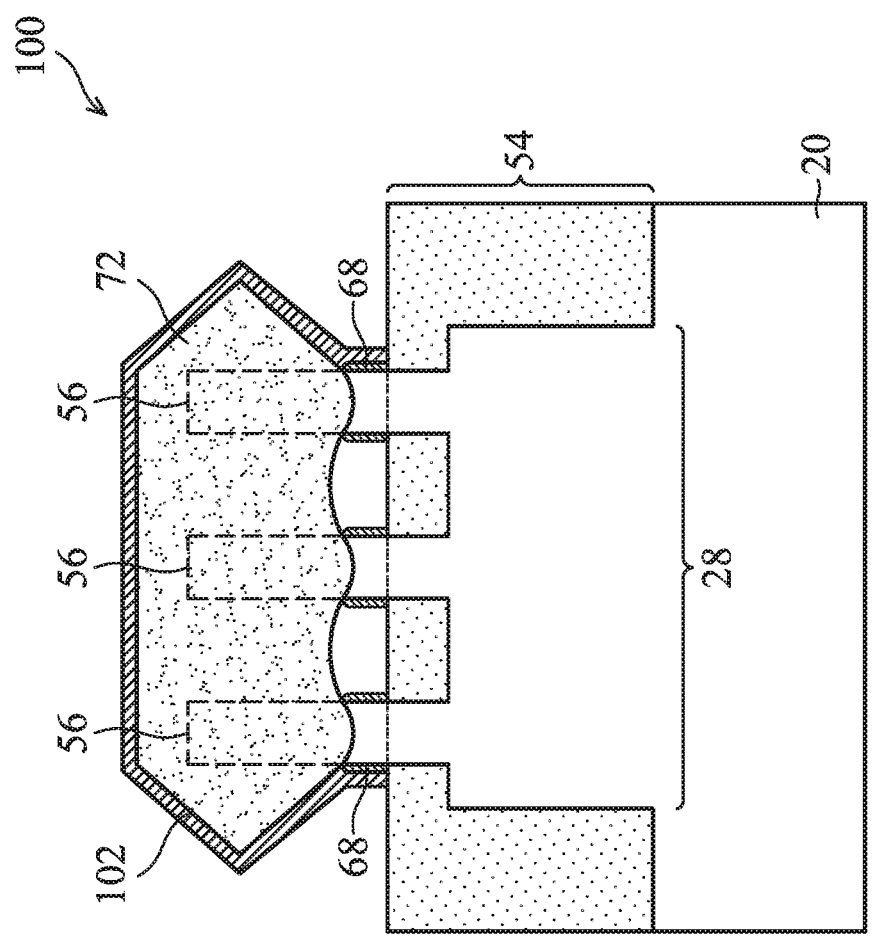

Turning to FIG. 8, a capping layer 102 is formed over epitaxy region 72. Capping layer 102 may also be formed over exposed portions of gate spacers 66, fin spacers 68, STI regions 54, semiconductor strips 28, or fins 56. In some embodiments, capping layer 102 extends below the epitaxy region 72, and the capping layer 102 may extend to a top surface of STI regions 54. Capping layer 102 may be formed using a process such as CVD, ALD, HDPCVD, LPCVD, or another process. In some embodiments, capping layer 102 may be conformal. Capping layer 102 may include one or more layers of a material such as silicon oxide, silicon oxycarbide, silicon oxycarbonitride, silicon nitride, silicon oxynitride, or another material. In some embodiments, capping layer 102 may be formed from a porous material such as porous silicon oxycarbonitride, porous silicon oxide, or porous low-k materials, or other types of porous materials. For example, a porous material such as porous silicon oxide may be formed using a thermal ALD process followed by an annealing process in the presence of water vapor, though other suitable techniques may be used. In some cases, capping layer 102 may be formed from a porous material having a porosity between about 5% and about 20%. In some embodiments, capping layer 102 is formed from the same material as gate spacers 66. In some embodiments, capping layer 102 is a low-k material. For example, capping layer 120 may have a value of k between about 3.0 and about 4.5. The material of capping layer 102 may have a lower k than that of the material of gate spacers 66. In some embodiments, capping layer 102 is a material having an atomic composition of less than about 20% nitrogen. In some embodiments capping layer 102 has an atomic percentage of nitrogen that is less than that of the spacer layer 64 (see FIG. 4). In some embodiments, capping layer 102 is formed to a thickness between about 10 Å and about 50 Å.

Figure 9:
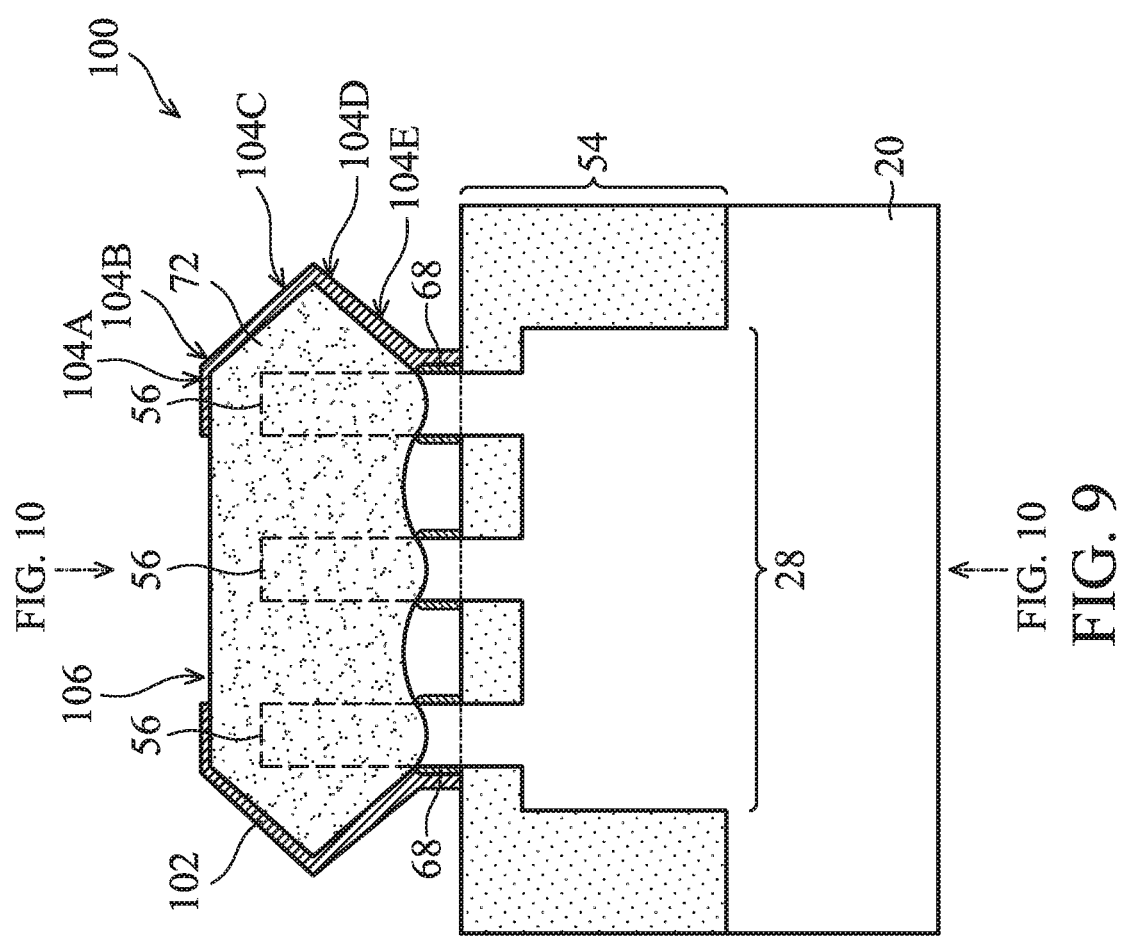

Next, as shown in FIG. 9, an etch process is performed on capping layer 102. The etch process may thin or remove portions of capping layer 102 so that source/drain contacts 88 (shown in FIG. 10) may be subsequently formed on epitaxy region 72. In some cases, the etch process may remove all of the material from some regions of capping layer 102, forming one or more openings 106 in capping layer 102 that expose epitaxy region 72. In some embodiments, openings 106 are formed in upper portions of capping layer 102, such as in top surfaces of capping layer 102. In subsequent steps, source/drain contacts 88 (see FIG. 10) may be formed on regions of epitaxy region 72 that are exposed by openings 106. In some embodiments, the etch process includes an isotropic dry etch process. For example, the etching process may include a plasma etch process using process gases such as $CH_3F$, $O_2$, $CH_4$, HBr, He, other gases, or a combination thereof. In some embodiments, the etch process includes an anisotropic dry etch process. In some embodiments, the etch process etches exposed portions of gate spacers 66 in addition to etching exposed portions of capping layer 102. In some embodiments, the etch process includes a wet etch process. In some cases, a wet etch process is performed after a dry etch process. The wet etch process may include a wet etchant such as HF, $H_2SO_4$, other wet etchants, or a combination of wet etchants. In some embodiments, the wet etch process may be a surface treatment process or surface cleaning process. FIG. 11 shows an embodiment after an etch process is performed on a capping layer 102 in which epitaxy regions 72 are unmerged, and in which each epitaxy region 72 is separately covered by the capping layer 102. In some embodiments having unmerged epitaxy regions 72, capping layer 102 may extend across adjacent epitaxy regions 72.

In some embodiments, the etch process etches upper portions of capping layer 102 (e.g., portions near the top of epitaxy region 72) more than it etches lower portions of capping layer 102 (e.g. portions near the bottom of epitaxy region 72). In some embodiments, the relative amounts of etching of different portions of the capping layer 102 may be controlled by controlling the etching parameters (e.g., duration or other parameters) of the etch process. In some embodiments, the etch process etches capping layer 102 such that portions of capping layer 102 near the bottom of epitaxy region 72 may be thicker than portions of capping layer 102 near the top of epitaxy region 72. For example, as shown in FIG. 9, remaining portions of capping layer 102 on upper surfaces of epitaxy region 72 (e.g., surfaces farther from the substrate 20, such as near 104A) may be thinner than remaining portions of capping layer 102 on lower surfaces of epitaxy region 72 (e.g., surfaces closer to the substrate 20, such as near 104E). In some cases, the etch process etching upper portions of capping layer 102 more than lower portions of capping layer 102 may result in the thickness of remaining capping layer 102 increasing gradually from upper surfaces of epitaxy region 72 to lower surfaces of epitaxy region 72. For example, as shown in FIG. 9, the remaining capping layer 102 may be thinner near 104A than near 104B, which may be thinner than near 104C, which may be thinner than near 104D, which may be thinner than near 104E. In some cases, the remaining capping layer 102 may be thicker on surfaces of an underside of epitaxy region 72 (e.g., near 104D or 104E) than on upper surfaces of epitaxy region 72 (e.g., near 104A, 104B, or 104C). In some embodiments, a thickness of capping layer 102 is less than, greater than, or about the same as a thickness of gate spacers 66 or a thickness of fin spacers 68. In some embodiments, a first portion of capping layer 102 has a thickness greater than a thickness of gate spacers 66 or a thickness of fin spacers 68 and a second portion of capping layer 102 has a thickness less than a thickness of gate spacers 66 or a thickness of fin spacers 68.

In some embodiments, remaining portions of capping layer 102 are between about 10 Å and about 50 Å thick. For example, a thickness of the remaining portions of the capping layer 102 near 104A may be between about 10 Å and about 30 Å, a thickness of the remaining portions of the capping layer 102 near 104B may be between about 15 Å and about 40 Å, a thickness of the remaining portions of the capping layer 102 near 104C may be between about 20 Å and about 40 Å, a thickness of the remaining portions of the capping layer 102 near 104D may be between about 20 Å and about 50 Å, or a thickness of the remaining portions of the capping layer 102 near 104E may be between about 25 Å and about 50 Å. In some embodiments, a ratio of a thickness near 104B to a thickness near 104A of the capping layer 102 is between about 1 and about 4, a ratio of a thickness near 104C to a thickness near 104A of the capping layer 102 is between about 1.2 and about 4.5, a ratio of a thickness near 104D to a thickness near 104A of the capping layer 102 is between about 1.4 and about 5, or a ratio of a thickness near 104E to a thickness near 104A of the capping layer is between about 1.6 and about 5.

Figure 10:
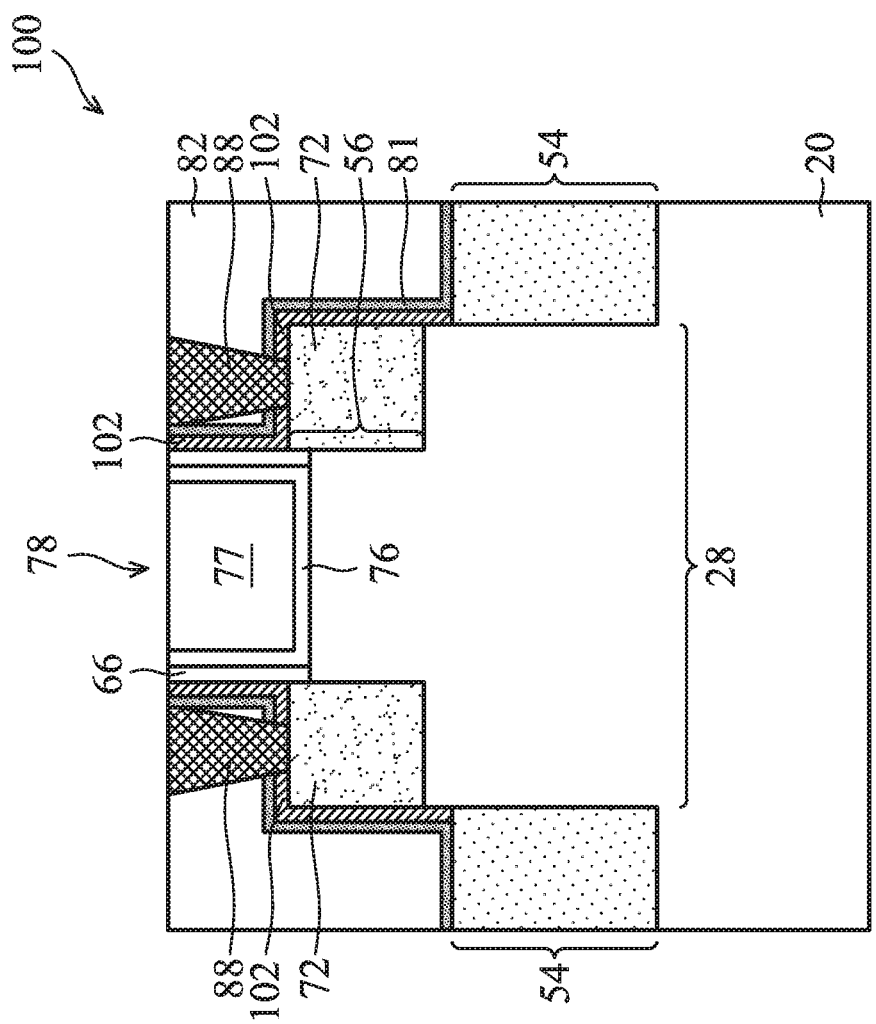

FIG. 10 illustrates a cross-sectional view of a portion of the structure shown in FIG. 9 (or FIG. 11) after additional processing steps, wherein the cross-sectional view is obtained from the vertical plane crossing the labeled line "FIG. 10" in FIG. 9 (or FIG. 11). An etch stop layer 81 and an Inter-Layer Dielectric (ILD) 82 are deposited over dummy gate stack 58 (e.g., over the mask 63), epitaxy regions 72, and capping layer 102. Etch stop layer 81 may be a dielectric material, such as silicon carbide, silicon nitride, silicon oxynitride, the like, or a combination. Etch stop layer 81 may be deposited by any suitable method, such as CVD, PECVD, a combination thereof, or the like. In some embodiments, the material of etch stop layer 81 is different than the material of the capping layer 102. In some embodiments, the etch stop layer 81 has a thickness between about 10 Å and about 100 Å. In an embodiment, the ILD 82 is a flowable film formed by a flowable CVD. In some embodiments, the ILD 82 is formed of a dielectric material such as Phospho-Silicate Glass (PSG), Boro-Silicate Glass (BSG), Boron-Doped Phospho-Silicate Glass (BPSG), undoped Silicate Glass (USG), a silicon oxide, or the like, and may be deposited by any suitable method, such as CVD, PECVD, a combination thereof, or the like. In some embodiments, the etch stop layer 81 is used as a stop layer while patterning the ILD 82 to form openings for subsequently formed source/drain contacts 88, described in greater detail below. Accordingly, a material for the etch stop layer 81 may be chosen such that the material of the etch stop layer 81 has a lower etch rate than the material of ILD 82.

A planarization process, such as a CMP, may be performed to level the top surface of ILD 82 with a top surface of dummy gate stack 58. After the planarization process, a top surface of dummy gate electrode 62 may be exposed through ILD 82. In some embodiments, the CMP may also remove the mask 63, or portions thereof, on dummy gate electrode 62. Remaining portions of mask 63, dummy gate electrode 62, and dummy gate dielectric 60 may be removed in one or more etching steps that expose channel regions of fins 56. A channel region of fin 56 may, for example, be the portion of the fin 56 disposed between neighboring pairs of epitaxy regions 72. The etching steps may include one or more dry etch processes or wet etch processes. In some embodiments, dummy gate dielectric 60 is used as an etch stop layer when dummy gate electrode 62 is etched. The dummy gate dielectric 60 may then be removed after the removal of the dummy gate electrode 62.

The dummy gate stack 58 as shown in FIG. 5 has been replaced with a replacement gate stack 78 as shown in FIG. 10. Replacement gate stack 78 includes gate dielectric 76 on the top surfaces and sidewalls of the respective fin 56, and gate electrode 77 over gate dielectric 76. The gate dielectric 76 is deposited conformally, such as on the top surfaces and the sidewalls of fin 56 and on a top surface of ILD 82. In some embodiments, the gate dielectric 76 includes one or more layers, including materials such as silicon oxide, silicon nitride, or combinations thereof. Gate dielectric 76 may be formed through thermal oxidation, and thus may include thermal silicon oxide. In some embodiments, prior to formation of gate dielectric 76, an interfacial layer (not shown) is formed on the exposed surfaces of the respective fin 56. The interfacial layer may include an oxide layer such as a silicon oxide layer, which may be formed through the thermal oxidation of the respective fin 56, a chemical oxidation process, or a deposition process. In some cases, the interfacial layer may include a silicon nitride layer, and in some cases the interfacial layer may include one or more layers of silicon oxide, silicon nitride, silicon oxycarbonitride, or another material. In other embodiments, gate dielectric 76 includes a high-k dielectric material, and in these embodiments, gate dielectric 76 may have a k value greater than about 7.0, and may include a metal oxide or a silicate of Hf, Al, Zr, La, Mg, Ba, Ti, Pb, or combinations thereof. The formation methods of gate dielectric 76 may include Molecular-Beam Deposition (MBD), ALD, PECVD, a combination thereof, or the like.

Gate electrode 77 is then formed on gate dielectric 76, and may be formed of one or more metal layers. Gate electrode 77 may be made of a metal-containing material such as TiN, TaN, TaC, Co, Ru, Al, Ag, Au, W, Ni, Ti, Cu, combinations thereof, or multi-layers thereof. After the formation of gate electrode 77, a planarization process, such as a CMP, may be performed to remove the excess portions of gate dielectric 76 and gate electrode 77, which excess portions are over the top surface of ILD 82. The resulting remaining portions of material of gate electrode 77 and gate dielectric 76 thus form replacement gate stack 78. The formation processes of replacement gate stack 78 may include forming additional layers such as barrier layers, work-function layers, or other layers not shown in FIG. 12 for clarity. Work-function layers for an n-type devices may include Ti, Ag, TaAl, TaAlC, TiAlN, TaC, TaCN, TaSiN, Mn, Zr, other suitable n-type work-function materials, or combinations thereof. Work-function layers for p-type devices may include TiN, TaN, Ru, Mo, Al, WN, $ZrSi_2$, MoSi TaSi $NiSi_2$, WN, other suitable p-type work-function materials, or combinations thereof. In some embodiments, portions of the epitaxy regions 72 are separated from replacement gate stack 78 by spacer layer 66. In some embodiments, an epitaxy region 72 is separated from replacement gate stack 78 by a distance about equal to the thickness of spacer layer 66.

Source/drain contacts 88 are formed to make electrical connections to the respective epitaxy regions 72. In some cases, photolithographic and etching processes are used to pattern ILD 82 and expose surfaces of epitaxy regions 72 within capping layer openings 106 (see FIGS. 9 and 11). A conductive material is formed within capping layer openings 106 to contact epitaxy regions 72, forming source/drain contacts 88. In some embodiments, a silicide (not shown) may be formed on epitaxy regions 72 prior to formation of source/drain contacts 88. A silicide may be formed by depositing a metal layer into the openings 106 and performing an anneal to react the metal layer with the exposed surface portions of epitaxy regions 72 to form a silicide. In some embodiments, unreacted portions of the metal layer are removed. In some cases, no portion of ILD 82 is disposed between source/drain contacts 88 and the portions of capping layer 102 that are disposed on spacer layer 66. In different embodiments, source/drain contacts 88 may be formed before or after formation of replacement gate stack 78, and each may be formed using separate photolithographic or etching processes. In some embodiments, source/drain contacts 88 are separated from replacement gate stack 78 by spacer layer 66, etch stop layer 81, and capping layer 102. In some embodiments, a distance between a source/drain contact 88 and gate electrode 77 is between about 10 nm and about 50 nm.

In some cases, by forming capping layer 102 between gate electrode 77 and source/drain contacts 88, the capacitance between gate electrode 77 and source/drain contacts 88 may be reduced. In some cases, this capacitance may be parasitic or otherwise undesirable, and the reduction of this capacitance may improve high-speed or AC performance of the device. As discussed previously, capping layer 102 may include a low-k material to further reduce any capacitance between gate electrode 77 and source/drain contacts 88. In this manner, the capacitance may between the gate electrode 77 and source/drain contacts 88 may be reduced without increasing the thickness of the gate spacer 66 or without decreasing the size of the epitaxy regions 72. By forming capping layer 102 after the formation of epitaxy regions 72, epitaxy regions 72 may be formed closer to the channel regions of semiconductor fin 56 without increasing the capacitance. In some cases, reducing the size of epitaxy regions or increasing the distance between the epitaxy regions and the channel of a device can reduce the DC performance (e.g., decrease $I_{ON}$) of the device. The use of an etching process (e.g., an isotropic dry etching process) to form openings in the capping layer for source/drain contacts can also thin the capping layer, allowing for decreasing the distance between the source/drain contacts and the gate electrode. In some cases, the etching process etches the capping layer such that upper portions of the capping layer are thinner than lower portions. In this manner, the thicker lower portions of the capping layer can provide additional protection to underlying features, while the upper portions of the capping layer are relatively thinner to decrease the distance the distance between the source/drain contacts and the gate electrode. In some cases, the use of capping layer 102 as described can improve the AC performance of a device without reducing the DC performance of the device. For example, the speed of the device or the high-frequency response of the device can be increased by decreasing the capacitance between the gate electrode and the contacts. In some cases, the performance of a device such as a FinFET or a ring oscillator may be improved in this manner.

In accordance with an embodiment, a method includes forming a semiconductor fin protruding from a substrate, forming a gate stack over the semiconductor fin, forming a first dielectric material on sidewalls of the gate stack, forming source and drain regions adjacent the gate stack, forming a second dielectric material on the top and sidewalls of the source and drain regions and on the first dielectric material, performing an etching process to form openings in the second dielectric material, the openings exposing the source and drain regions, and forming a third dielectric material on the second dielectric material, the third dielectric material different from the second dielectric material. In an embodiment, the second dielectric material includes a low-k dielectric material. In an embodiment, the etching process includes an isotropic dry etch. In an embodiment, the etching process further includes a wet etch. In an embodiment, after the etching process, a first portion of the second dielectric material present on the source and drain region is thicker than a second portion of the second dielectric material present on the source and drain region, wherein the second portion is farther from the substrate than the first portion. In an embodiment, the remaining portions of the second dielectric material present on the source and drain regions are between about 10 Å and about 50 Å thick. In an embodiment, the second dielectric material includes a porous material. In an embodiment, the second dielectric material includes SiOCN. In an embodiment, the third dielectric material is an etch stop layer. In an embodiment, the method further includes forming an Inter-Layer Dielectric (ILD) material over the third dielectric material.

In accordance with an embodiment, a method includes patterning a substrate to form a semiconductor strip, forming a dummy gate stack over a channel region of the semiconductor strip, forming gate spacers on sidewalls of the dummy gate stack, epitaxially growing a source/drain region adjacent the channel region, forming a conformal capping layer over the gate spacers and the source/drain region, performing an etching process on the capping layer, the etching process forming an opening in the capping layer over the source/drain region, and after performing the etching process, forming an Inter-Layer Dielectric (ILD) over the capping layer. In an embodiment, the etching process includes an isotropic dry etch. In an embodiment, the etching process further includes a surface cleaning process using a wet etch. In an embodiment, the etching process etches a first portion of the capping layer on the sidewall of the source/drain region more than the etching process etches a second portion of the capping layer on the sidewall of the source/drain region, the first portion being above the second portion.

In accordance with an embodiment, a semiconductor device includes a fin extending from an upper surface of a substrate, a gate stack disposed over the fin, a first dielectric material disposed on a sidewall of the gate stack, an epitaxy region disposed adjacent the fin, a second dielectric material disposed on the epitaxy region and on a sidewall of the first dielectric material, wherein the second dielectric material has a greater thickness in a first portion over the epitaxy region than in a second portion over the epitaxy region disposed closer to the substrate than the first portion, a third dielectric material disposed on the second dielectric material, and a conductive feature extending through the third dielectric material and the second dielectric material to contact the epitaxy region. In an embodiment, the semiconductor device further includes a conductive feature extending through the second dielectric material to contact the epitaxy region. In an embodiment, the second dielectric material has a lower dielectric constant than the first dielectric material. In an embodiment, the second dielectric material has a smaller concentration of nitrogen than the first dielectric material. In an embodiment, the first dielectric material has a greater thickness than the second dielectric material. In an embodiment, the second dielectric material has a thickness between about 10 Å and about 50 Å.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming a semiconductor fin protruding from a substrate;
   forming a gate stack over the semiconductor fin;
   forming a first dielectric material on sidewalls of the gate stack;
   forming source and drain regions adjacent the gate stack;
   forming a second dielectric material on the top and sidewalls of the source and drain regions and on the first dielectric material, wherein the second dielectric material comprises a porous material;
   performing an etching process to form openings in the second dielectric material, the openings exposing the source and drain regions; and
   forming a third dielectric material on the second dielectric material, the third dielectric material different from the second dielectric material.

2. The method of claim 1, wherein the porous material comprises a low-k dielectric material.

3. The method of claim 1, wherein the etching process comprises an isotropic dry etch.

4. The method of claim 3, wherein the etching process further comprises a wet etch.

5. The method of claim 1, wherein after the etching process, a first portion of the second dielectric material present on the source and drain region is thicker than a second portion of the second dielectric material present on the source and drain region, wherein the second portion is farther from the substrate than the first portion.

6. The method of claim 1, wherein, after the etching process, remaining portions of the second dielectric material present on the source and drain regions are between about 10 Å and about 50 Å thick.

7. The method of claim 1, wherein the third dielectric material is an etch stop layer.

8. The method of claim 7, further comprising forming an Inter-Layer Dielectric (ILD) material over the third dielectric material.

9. A method comprising:
   patterning a substrate to form a semiconductor strip;
   forming a dummy gate stack over a channel region of the semiconductor strip;
   forming gate spacers on sidewalls of the dummy gate stack;
   epitaxially growing a source/drain region adjacent the channel region;
   forming a conformal capping layer over the gate spacers and the source/drain region;
   performing an etching process on the capping layer, the etching process forming an opening in the capping layer over the source/drain region, wherein the etching process comprises an isotropic dry etch; and
   after performing the etching process, forming an Inter-Layer Dielectric (ILD) over the capping layer.

10. The method of claim 9, wherein the etching process further comprises a surface cleaning process using a wet etch.

11. The method of claim 9, wherein the etching process etches a first portion of the capping layer on the sidewall of the source/drain region more than the etching process etches a second portion of the capping layer on the sidewall of the source/drain region, the first portion being above the second portion.

12. The method of claim 9, wherein the capping layer comprises silicon oxycarbonitride.

13. The method of claim 9, wherein the capping layer comprises a porous material.

14. The method of claim 9, wherein a third portion of the capping layer over the source/drain region has a first thickness that is smaller than a second thickness of a fourth portion of the capping layer over the source/drain region, wherein the fourth portion is closer to the substrate than the third portion.

15. A method comprising:
   forming a fin extending from an upper surface of a substrate;
   forming a gate stack over the fin;
   depositing a first dielectric material on a sidewall of the gate stack;
   forming an epitaxy region in the fin adjacent the gate stack;
   depositing a second dielectric material on the epitaxy region and on a sidewall of the first dielectric material, wherein a first portion of the second dielectric material over the epitaxy region has a first thickness that is smaller than a second thickness of a second portion of the second dielectric material over the epitaxy region, wherein the second portion is closer to the substrate than the first portion;
   depositing a third dielectric material on the second dielectric material; and
   forming a conductive feature extending through the third dielectric material and the second dielectric material to contact the epitaxy region.

16. The method of claim 15, wherein a ratio of the second thickness to the first thickness is between 1:1 and 5:1.

17. The method of claim 15, wherein the second dielectric material has a lower dielectric constant than the first dielectric material.

18. The method of claim 15, wherein the second dielectric material has a smaller concentration of nitrogen than the first dielectric material.

19. The method of claim 15, wherein the first dielectric material has a greater thickness than the second dielectric material.

20. The method of claim 15, wherein the second dielectric material has a thickness between about 10 Å and about 50 Å.

* * * * *